[12] United States Patent
Suzuki et al.

(10) Patent No.: US 6,280,060 B1
(45) Date of Patent: Aug. 28, 2001

(54) COOLING ARRANGEMENT OF A HEATING DEVICE OF THE LIGHT IRRADIATION TYPE

(75) Inventors: Shinji Suzuki, Kawasaki; Takeshi Minobe, Yokohama, both of (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/368,904

(22) Filed: Aug. 6, 1999

(30) Foreign Application Priority Data

Aug. 6, 1998 (JP) .................................................. 10-223252

(51) Int. Cl.[7] ....................................................... F21V 29/00
(52) U.S. Cl. ............................................. 362/294; 362/373
(58) Field of Search ................................. 313/15, 11, 13, 313/24; 362/294, 373

(56) References Cited

FOREIGN PATENT DOCUMENTS 8-45863 * 2/1996 (JP) .

* cited by examiner

Primary Examiner—Nimeshkumar D. Patel
Assistant Examiner—Kevin Quarterman
(74) Attorney, Agent, or Firm—Nixon Peabody LLP; David S. Safran

(57) ABSTRACT

A cooling arrangement of a heating device of the light irradiation type in which, even when the wafer is heated to a high temperature of roughly 800 to 1200° C., the respective parts, such as the arc tube portion of the lamp, the insertion tube, the sealing area and the like can be easily controlled to a suitable temperature is achieved in a heating device of the light irradiation type, in which several lamps are disposed in a light irradiation chamber, each lamp having an arc tube portion, at least one insertion tube and at least one sealing area arranged on an at least one end of the arc tube portion, by the provision of a mirror which reflects the light from the arc tube portions behind the arc tube portions of the lamps and which has opening through which the insertion portion and the sealing areas pass; a cover chamber which has a plate with opening through which the sealing area of the lamps pass, and a cover with an opening for cooling air; and a wind box which is located between the plate of the cover chamber and the mirror and which is connected via a channel to an air mover, e.g., a blower, for drawing in or blowing in a cooling air flow. The air mover is connected to the opening for cooling air in the cover via the opening of the cover chamber plate, the wind box and the channel and being connected to the opening for cooling air in the light irradiation chamber via the opening of the mirror, the wind box and the channel.

5 Claims, 6 Drawing Sheets

COOLING ARRANGEMENT OF A HEATING DEVICE OF THE LIGHT IRRADIATION TYPE

BACKGROUND OF THE INVENTION

1. Field of the Invention

The invention relates to a heating device of the light irradiation type in which a semiconductor wafer (hereinafter called a wafer) is heated by light to form layers, for diffusion, annealing and the like.

2. Description of the Related Art

Heat treatment of the light irradiation type in the production of semiconductors is preformed in wide areas, such as in forming layers, diffusion, baking and the like.

In each of these treatments, a wafer is heated to a high temperature and treated. If, for this purpose, a heating device of the light irradiation type is used, the wafer can be quickly heated. The temperature of the wafer can be increased to 1000° C. or greater after ten and a few seconds to a few dozen seconds. Furthermore, rapid cooling can be achieved when light irradiation is stopped.

A heating device of the light irradiation type is described, for example, in Japanese patent disclosure document HEI 8-45863. FIG. 1 shows this heating device. In the figure, a light irradiation chamber 1 is shown in which a wafer is seated on a wafer holding plate 2, heated and irradiated. The light source part for heating this wafer 3 has an arrangement in which several ring-shaped IR lamps 4, each with a different diameter, are arranged concentrically. A mirror 5 which is made of a metal, such as aluminum or the like, is provided with concentric grooves and with opening 6 through which insertion portion 8 of the lamps 4 pass. The shape of the lamp 4 is such that the lamp 4 fits into the groove. The reflection surface of the mirror 5 is galvanized with a metal which, during operation of the lamps 4, reflects the IR radiation emitted from the lamp 4, for example, gold. A fused silica glass window 9 is used to close off the chamber 1 relative to the lamps 4 when the atmosphere in the vicinity of the wafer 3 is different from the atmosphere in the vicinity of the lamps 4.

Due to the light from the lamps 4, the mirror 5 is caused to have a high temperature. Therefore, a cooling is provided according to the material of the mirror 5 and the heat resistance temperature of galvanization of the surface. If air cooling alone is not adequate, there is a water cooling device or the like. For example, in the case in which the mirror is made of aluminum the aluminum melts at temperatures of 600° C. or greater. Here, water cooling is provided.

FIG. 2 shows an example of a lamp 4 which is used for a light source. The lamp has an arc tube portion 7 in which a light emitting filament 12 is located, insertion portion 8 which are located on the ends of the arc tube portion 7, and sealing areas 11 by which the ends of the insertion portion 8 are hermetically sealed and which have sealing foils through which the filaments 12 and power supply lines 19 are joined to one another.

As shown in FIG. 3, the sealing areas 11 and the insertion portion 8 of the lamp 4 pass through the opening 6 of the mirror 5. The arc tube portion 7 is located in the concentric groove of the mirror 5 and the lamp 4 is attached by means of an attachment component (not shown). As is shown in FIG. 1, the sealing areas 11 project upwardly out of the mirror 5. The lines 19 from the sealing areas 11 are connected to a lamp power source via connectors, terminal devices or the like.

FIG. 4 is a schematic in which the light source part which is provided with lamps 4 is shown from the side facing the wafer in FIG. 1. The cross-hatched area represents the through opening 6 of the mirror 5 through which the insertion tube 8 of the lamp 4 passes. Reference number 7 indicates the arc tube portion and 12 the filament in the arc tube.

In this conventional device, it is necessary to conduct cooling in such a way that the respective part of the lamp 4 reaches a suitable temperature. However, this point has not been adequately considered.

This means that, during operation of lamps, the respective part must be kept at a suitable temperature in consideration of the following:

1. The surface temperature of the bulb of the arc tube portion 7 in which the filament 12 emits light must be no greater than 800° C. If the input power of the lamp 4 is increased for treatment of the wafer 3, the amount of light emitted from the filaments 12 is increased. In this way, the temperature of the bulb of the lamp 4 is increased. At a bulb temperature at least equal to 800° C., the fused silica glass comprising the bulb recrystallizes, and thus milky opacification occurs; this is called "devitrification." When devitrification occurs, the transmission factor of the light decreases and the lamp 4 can no longer deliver a stipulated radiant energy to the wafer 3.

2. The sealing area 11 must have a temperature no greater than 300° C. At a higher temperature, the sealing foil (molybdenum foil) is oxidized and expanded. This causes cracks in the sealing area 11 and the sealing area 11 is damaged.

3. The insertion tube 8 must have a temperature of at least equal to 250° C. At a lower temperature, a tungsten-halogen compound condenses and accumulates on the inside wall of the insertion tube 8 which has a low temperature. Here, the tungsten-halogen compound consists of the halogen gas which fills the lamp 4 and the tungsten which has vaporized from the filament 12. The halogen cycle in which the vaporized tungsten is converted into a tungsten-halogen compound and returns again to the filament 12 therefore no longer exists; this causes dilution and burning through of the filament 12. The service life of the filament 12 therefore becomes shorter. Since the vaporized halogen gas diminishes, the phenomenon occurs that the vaporized tungsten is deposed on the inner wall of the arc tube portion 7 without reaction with the halogen. When blackening occurs, the radiant energy from the filament 12 is absorbed by the blackened area. The wafer 3 can therefore no longer be irradiated with a stipulated energy. The insertion tube 8 must therefore have a temperature of at least equal to 250° C. Since the insertion tube 8 is an area which does not contribute to light irradiation of the wafer 3 and is not provided with an emission part of the filament 12, the temperature in this area often becomes low. It is therefore necessary to control the temperature of the insertion tube 8 to a suitable temperature.

4. The heat treatment device for the wafer 3 must heat the wafer to a temperature of 800 to 1200° C. Recently, an oxide layer has been produced in general at 1150° C. When the lamp 4 is operated using the device shown in FIG. 1, no cooling of the lamp 4 is accomplished. To keep the temperature of the bulb of the arc tube portion 7 of the lamp 4 less than or equal to 800° C., the maximum power per unit of length of the filament which can be supplied to the lamp 4 is 60 W/cm; this is not adequate for heating of the wafer 3 to 800 to 1200° C.

To eliminate the above described defect it can also be imagined that the lamp input power can be increased and cooling air blown onto the lamp 4 at the same time to cool it. However, here only the temperature of the area of the lamp 4 on which cooling air is blown (the side opposite the mirror 5) is reduced, it being difficult for the cooling air to penetrate into the gap between the mirror 5 and the lamp 4. Therefore, it is difficult to cool this area (the area opposite the mirror 5). Furthermore, in addition to temperature control of the arc tube portion 7, it is necessary to keep the sealing area 11 and the insertion tube 8 in the above described temperature range. As a result, in each part, there must be several temperature control devices, causing the disadvantage that the device has a complicated arrangement.

SUMMARY OF THE INVENTION

The invention was devised to eliminate the above described disadvantages of the prior art. Therefore, a primary object of the present invention is to devise a cooling arrangement of a heating device of the light irradiation type in which, even when the wafer is heated to a high temperature of roughly 800 to 1200° C., the respective part, such as the arc tube portion of the lamp, the insertion tube, the sealing area and the like can be easily controlled to a suitable temperature.

This object is achieved in accordance with the present invention by a heating device of the light irradiation type in which several lamps are provided in a light irradiation chamber, each lamp consisting of an arc tube portion, insertion portion and sealing areas which are each arranged on the ends of the arc tube portion, comprising the following:

a mirror, which reflects the light from the arc tube portions, behind the arc tube portions of the lamps and which has opening through which the insertion portion and the sealing areas pass;

a cover chamber which has a plate with opening through which the sealing area of the lamps pass, and a cover with an inlet opening for cooling air; and a wind box which is located between the plate of the cover chamber and the mirror, and which is connected via a channel to an evacuation means, the evacuation means being connected to the inlet opening for cooling air in the cover via the opening of the cover chamber plate, the wind box and the channel, and being connected to the inlet opening for cooling air in the light irradiation chamber via the opening of the mirror, the wind box and the channel.

The object is moreover advantageously achieved according to the invention in that the above described cover is provided with an inlet opening for cooling air in which the size of the opening can be changed.

In addition, the object is advantageously achieved in accordance with the invention by a heating device of the light irradiation type in which there are several lamps in the light irradiation chamber, the respective lamp consisting of an arc tube portion and insertion portion and sealing areas which are arranged each on the ends of the arc tube portion, comprising the following:

a mirror which reflects the light from the arc tube portions behind the arc tube portions of the lamps and which has opening through which the insertion portion and the sealing areas pass;

a cover chamber which has a plate with opening through which the sealing areas of the lamps pass, and a cover with an outlet opening for cooling air; and a wind box which is located between the plate of the cover chamber and mirror and which is connected via a channel to an air injection means, air being blown in by this air injection means via the channel, the wind box and the opening of the plate of the cooling air outlet opening of the cover, and air being blown in through the channel, the wind box, the opening of the mirror and the light irradiation chamber into the cooling air outlet opening of the light irradiation chamber, and thus, the lamps and the like being cooled.

The object is furthermore achieved in that the above described cover has an outlet opening for cooling air in which the size of the opening can be changed.

In the following, the invention is described in greater detail using, for illustration purposes only, the embodiments shown in the drawings.

DETAILED DESCRIPTION OF THE INVENTION

Figure 1:
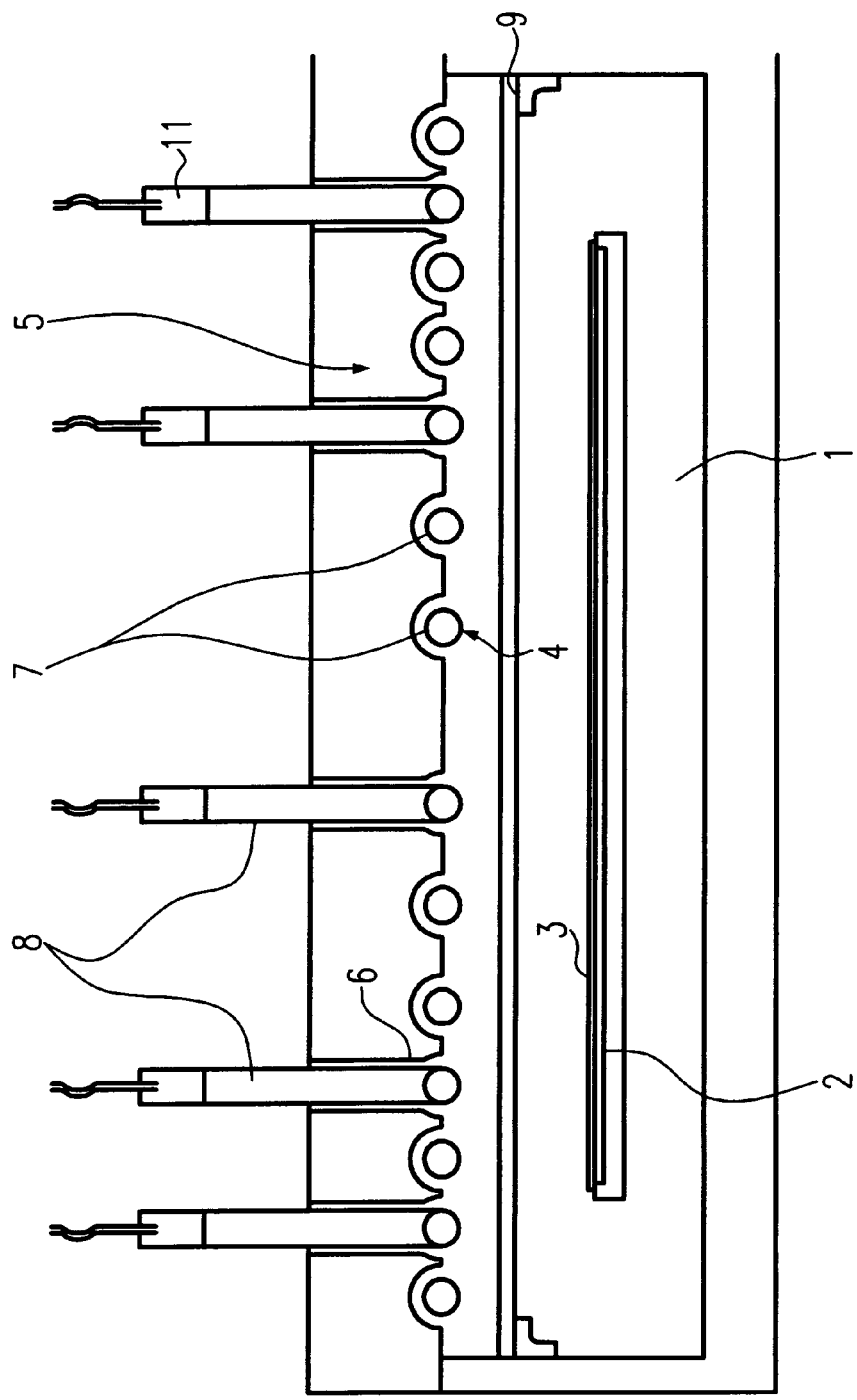
FIG. 1 is a schematic cross section of a conventional heating device of the light irradiation type.
Figure 2:
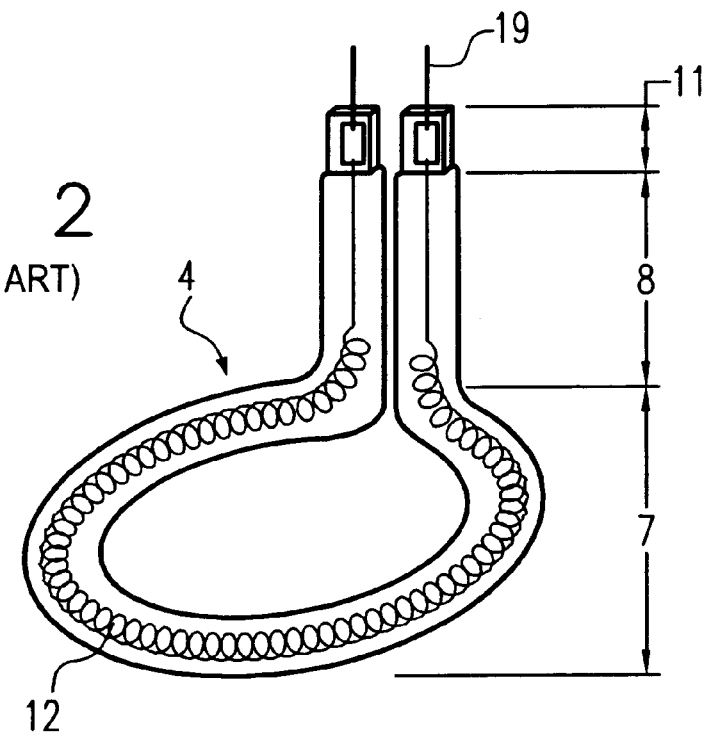
FIG. 2 is a perspective representation of a lamp used for the light source of the FIG. 1 heating device.
Figure 3:
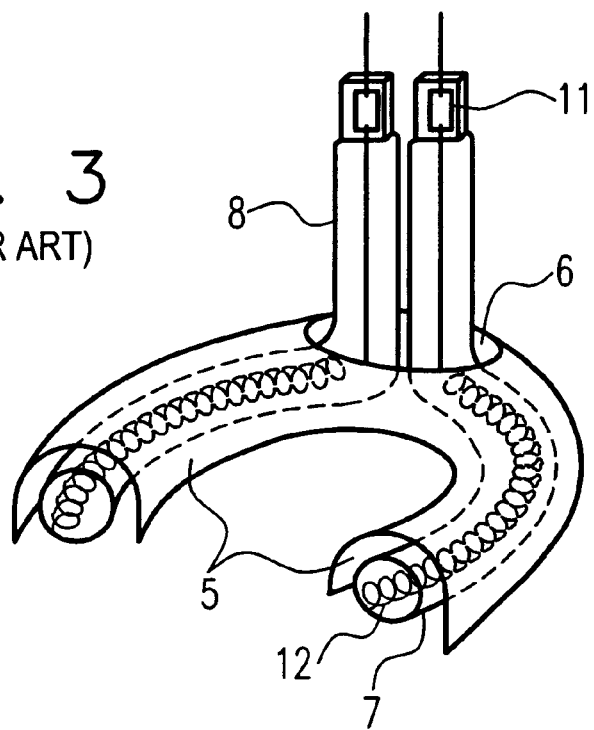
FIG. 3 is a perspective representation of the relation between the reflection surface of a mirror and the lamp.
Figure 4:
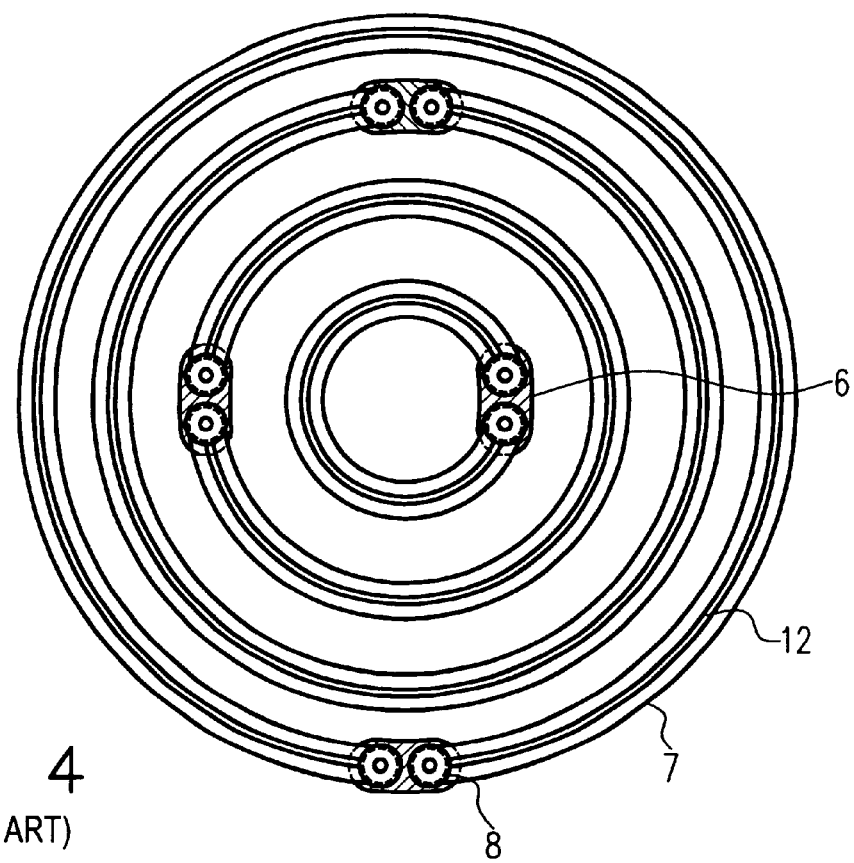
FIG. 4 is a schematic plan view of the side of the light source part of the FIG. 1 heating device that faces the wafer.

In the drawings, plate 10 by which the back of the mirror 5 is separated and there is a wind box 13 as the passage for cooling air. The back of the plate 10 is separated by a cover 14. Thus a cover chamber 15 is formed. The cover 14 is provided with an inlet opening 17 for cooling air which cools the sealing areas 11.

In the lower area of the cover chamber 15, plate 10 is provided with opening 16 through which the sealing areas 11 and the insertion portion 8 of the lamp 4 partially pass. The insertion portion 8 of the lamps 4 penetrate the mirror 5 and the wind box 13, and the sealing areas 11 reach the cover chamber 15.

The plate 10 in the cover chamber 15 is provided with lamp holding components 18 for securing the insertion portion 8 and for attaching the lamps 4, with terminals devices 23 by which the lines 19 of the lamps are connected to the line from the lamp power source, and the like.

Figure 5:
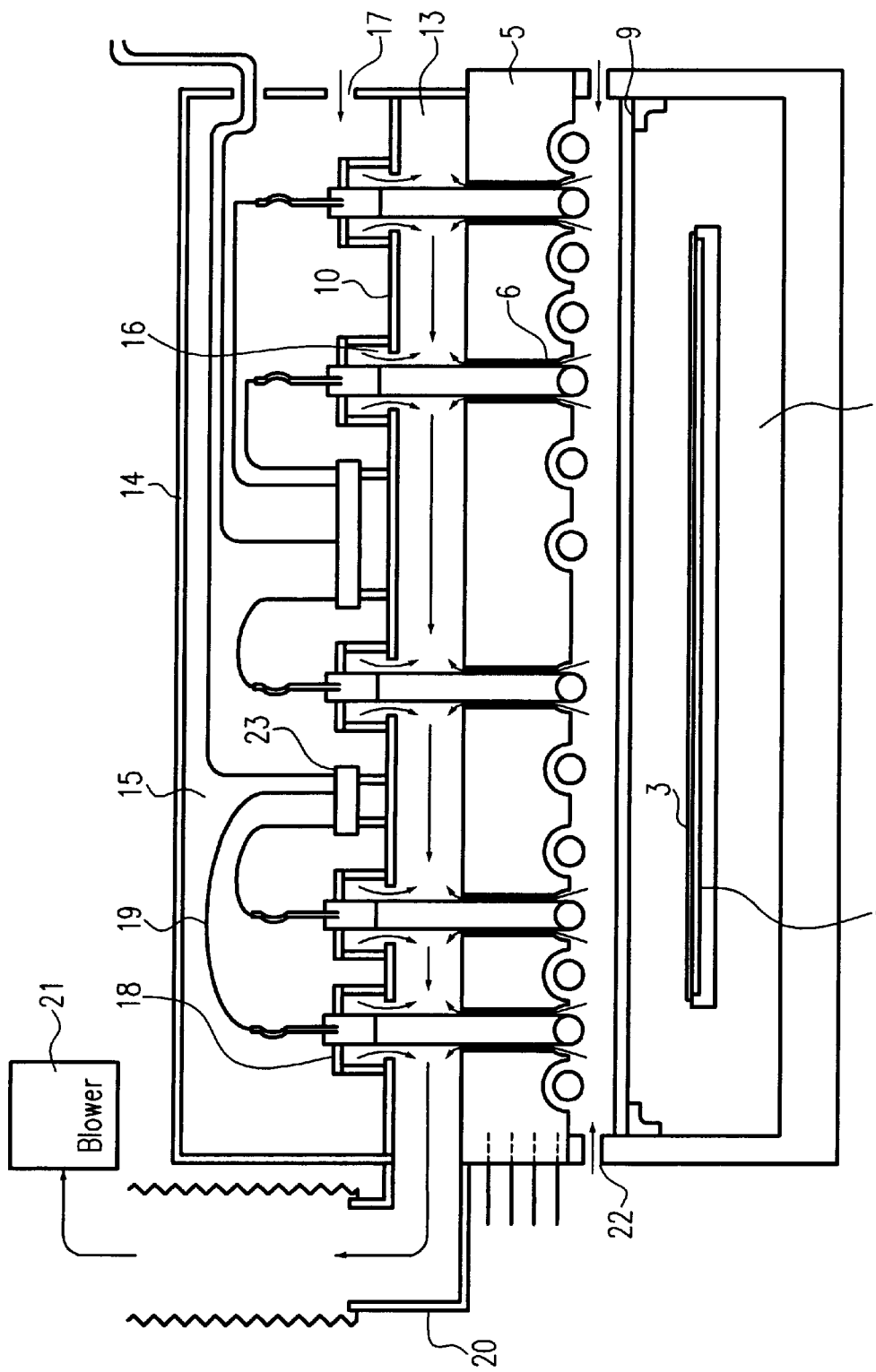
FIG. 5 is a schematic cross section of the cooling arrangement in accordance with the invention in a heating device of the light irradiation type.

The wind box 13 is a hollow space which is present between the upper area of the mirror 5 and the plate 10. A channel 20, which is connected to an evacuation means 21 (blower), is connected to one end of the wind box 13. The cross sectional area of the wind box 13 which is perpendicular to the flow of cooling air (in FIG. 5 the area which is formed by the intersection of the side of the cover chamber of the side of the light irradiation chamber and through which the cooling air passes) is moderately larger than the sum of the areas of the openings which are located in the mirror 5 and the plate 10. Since the amount of cooling air is determined by the area of these openings, within several opening 6 of the mirror 5, essentially the same amount of air passes and essentially the same amount of air passes through the opening 16 of the plate 10.

In the light irradiation chamber 1, a wafer 3 which is subjected to photo-heat treatment is seated on the wafer receiving plate 2. In the light irradiation chamber 1, there is an inlet opening 22 for cooling air which cools the lamps 4. When the size of the inlet opening 22 for the cooling air is made variable, the temperature of the arc tube portion 7 and the insertion portion 8 of the lamps 4 can be controlled.

Figure 6:
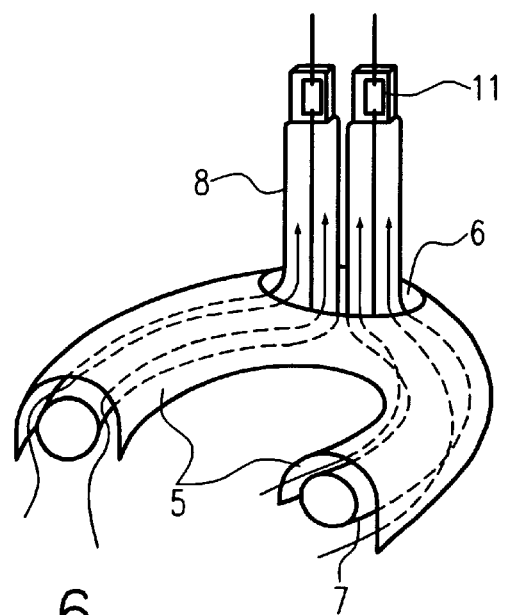
FIG. 6 is a schematic of the flow of cooling air in the cooling arrangement of the invention.

When the lamps 4 are operated, the blower 21 is turned on and the wind box 13 is subjected to a reduced pressure. As a result, air from outside is admitted as cooling air through the inlet opening for cooling air 22 of the light irradiation chamber 1 and penetrates from the surfaces of the lamps 4 into the gap between the lamps 4 and the mirror 5, passes through the opening 6 which are penetrated by the insertion portion 8 of the lamps 4, reaches the wind box 13, is drawn from the wind box 13 by the blower 21 and is discharged via the channel 20 (see also FIG. 6).

On the other hand, cooling air is supplied from the outside also through the inlet opening for cooling air 17 of the cover 14 of the cover chamber 15, cools the sealing areas 11 of the lamps 4, passes through the opening 16 of the plate 10, reaches the wind box 13, is drawn by the blower 21 and is discharged by the wind box 13 via the channel 20.

Figure 7:
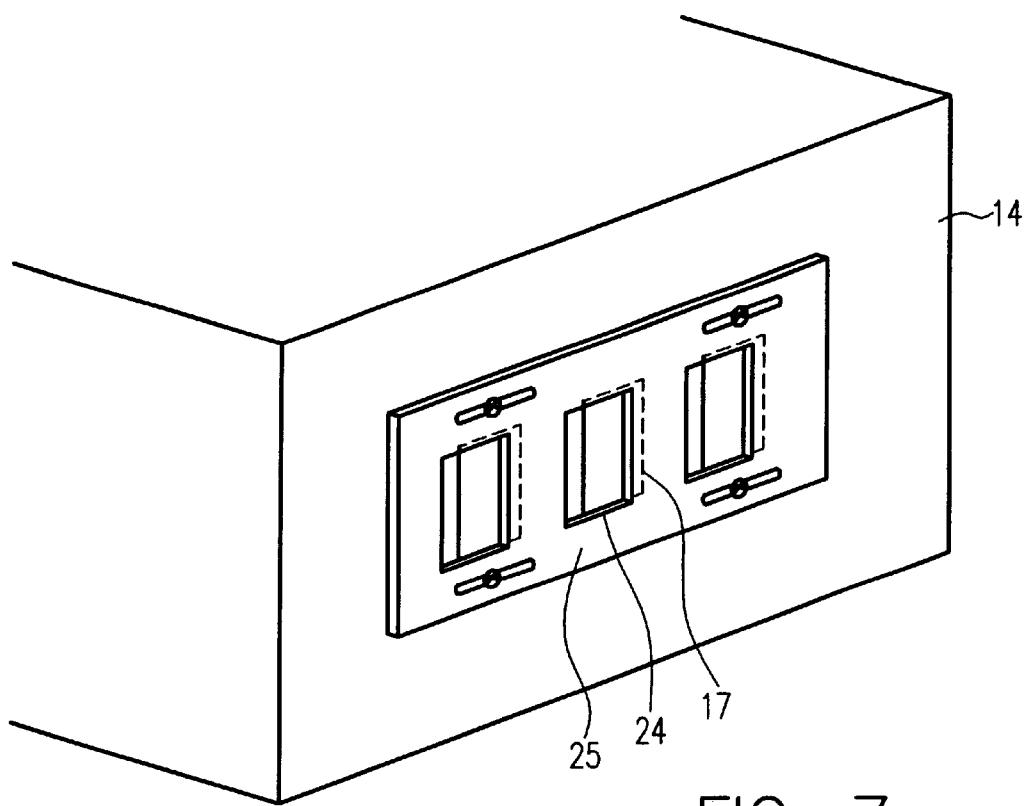
FIG. 7 is a schematic perspective view of an arrangement for control of the amount of cooling air in the cooling arrangement according to the invention.

If the size of the inlet opening for cooling air 17 of the cover 14 of the cover chamber 15 can be controlled, the amount of cooling air for the sealing areas 11 can be controlled. FIG. 7 shows an example of a means by which the inlet opening size can be regulated. In particular, a regulator sheet 25 is mounted to slide in front of the cooling air inlet opening 17 of the cover 14 and sheet 25 is provided with openings 24. Thus, the amount of cooling air can be controlled by moving the regulator sheet 25. Furthermore, this arrangement can also be provided for the cooling air inlet opening 22. However, in the case in which the cover chamber 15 lacks a cover 14, by changing the size of the opening 16 of the plate 10 the amount of cooling air in the sealing areas 11 can be controlled.

The measure that the fused silica glass window 9 is located between the lamps 4 and the wafer 3 can prevent the air flow due to the lamp cooling air from influencing the atmosphere in the vicinity of the wafer 3. Here, the inlet opening for the lamp cooling air 22 is located between the fused silica glass window 9 and the lamps 4.

This arrangement of the light source part of the device makes it possible to bring the temperature of the respective part of the lamp 4 to the desired temperatures even if the lamp is supplied with a power per unit of length of the filament from 80 to 120 W/cm and the wafer has been heated to 800 to 1200° C. This means that the surface temperature of the lamps can be cooled to a temperature of 800° C. or less because the cooling air from the inlet opening 22 from the surfaces of the lamps 4 penetrates into the gap between the lamps 4 and the mirror 5 and cools all the arc tube portions 7 of the lamps 4.

This cooling air thus has a high temperature because heat has been taken from the lamp 4. Subsequent passage of this cooling air through the opening 6 and through the vicinity of the insertion portion 8 of the wind box 13 makes it possible to keep the temperature in the vicinity of the insertion portion 8 at least equal to 250° C. Therefore, shortening of the service life of the filaments 12 and blackening of the lamps 4 as a result of a drop in temperature of the insertion portion 8 can be prevented. If the size of the inlet opening 22 can be controlled, a suitable amount of air can be attained and the temperature of the arc tube portions 7 and of the insertion portion 8 of the lamps 4 can be easily controlled.

The sealing areas 11 can be cooled to 350° C. or less by the measure that cooling air at room temperature penetrates from the cooling air inlet opening 17 in the cover 14 and cools the sealing areas 11. This cooling air which has cooled the sealing areas 11 passes through the opening 16 of the plate 10 and reaches the wind box 13. If the size of the inlet opening 17 of the cover 14 can be controlled, a suitable amount of cooling air can be attained and the temperature of the sealing areas 11 and of the insertion portion 8 of the lamps 4 can be easily controlled.

In the following, using FIG. 8 another embodiment of the invention will now be described. In the embodiment shown in FIGS. 5–7, the evacuation means 21 is connected to the channel 20 which is connected to the wind box 13 and cooling is performed by evacuation. In the embodiment shown in FIG. 8, instead of the evacuation means 21 (blower), an air injection means 30 (compressed air feed means) is connected and cooling is performed by blowing in air. However, the remainder of the arrangement in this case is essentially identical to the arrangement in the embodiment shown in FIGS. 5–7.

In the operation of lamps 4, the compressed air feed means 30 is operated and air is blown into the wind box 13. The air blown in by the compressed air feed means 30 passes through the channel 20 and passes as cooling air from the wind box 13 through the opening 6 which are penetrated by the insertion portion 8 of the lamps 4. The cooling air penetrates into the gap between the lamps 4 and the mirror 5, cools the lamps 4 and is evacuated to the outside (discharged) from the cooling air outlet opening 34 of the light irradiation chamber 1.

Figure 8:
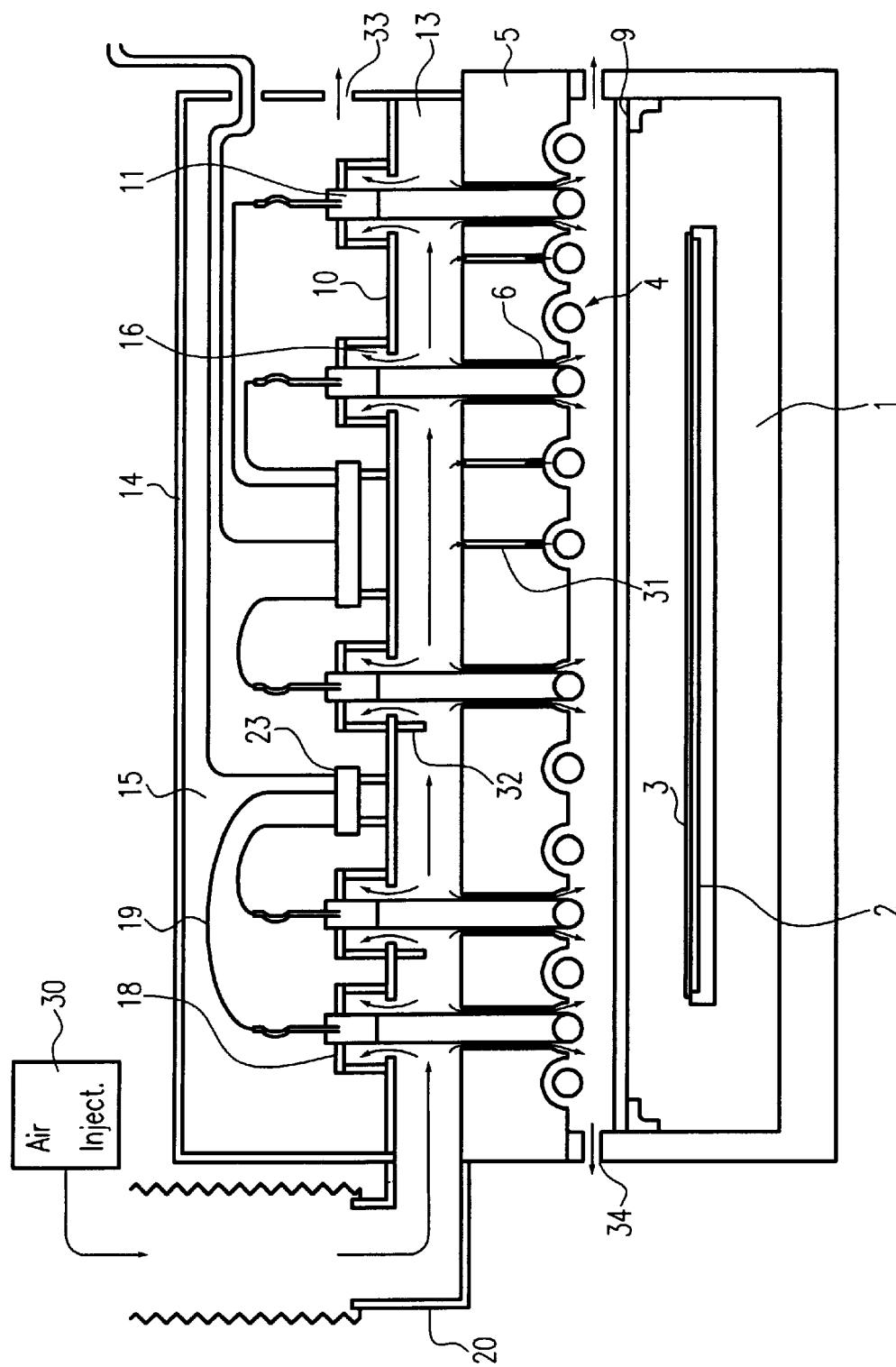
FIG. 8 is a cross section of another cooling arrangement for a heating device of the light irradiation type according to the invention.

Furthermore, as shown in FIG. 8, in the mirror 5, in the vicinity of the arc tube portions 7 of the lamps 4 there are ventilation passages 31 which are several openings with a small diameter or which are slotted opening. Thus, the cooling air flows into the ventilation passages 31. The air blown into the wind box 13 passes as cooling air through the ventilation passages 31, is blown into the arc tube portions 7 of the lamps 4 and cools the lamps 4.

On the other hand, the air blown in from the compressed air feed means 30 passes from the wind box 13 through the opening 16 of the plate 10, cools the sealing areas 11 of the lamps 4, and is evacuated to the outside (discharged) also from the cooling air outlet opening 33 of the cover 14 of the cover chamber 15.

As in the above described embodiment, the size of the cooling air outlet opening 33 of the cover 14 of the cover chamber 15 is controlled in the manner described in FIG. 7, and thus, the amount of cooling air in the sealing areas 11 is controlled.

Even if cooling has been produced by blowing in air, the temperature of the respective part of the lamps 4 could be brought to the desired temperature as in cooling by drawing in air.

This means that the cooling air from the opening 6 penetrates from the surfaces of the lamps 4 into the gap between the lamps 4 and the mirror 5, and cools all the arc tube portions 7 of the lamps 4. Furthermore, the cooling air is blown from the ventilation passages 31 into the arc tube portions 7 of the lamps 4 and thus cooling is produced. Therefore, the temperature of the lamp surface can be cooled to 800° C. or below.

The temperature in the vicinity of the insertion portion 8 is controlled with consideration of the equilibrium between the heat as a result of heat conduction from the arc tube portions 7 and cooling by the cooling air and by controlling the amount of air blown in. Furthermore, the amount of cooling air can be controlled to a suitable amount of air by the fact that the size of the cooling air outlet opening 34 from which the cooling air is evacuated can be controlled.

Additionally, a cover 32 can be provided to prevent the insertion portion 8 from being directly affected by the cooling air, as is shown in FIG. 8, when the insertion portion 8 have been cooled to excess and the halogen cycle can no longer be maintained. In this way, the temperature in the vicinity of the insertion portion 8 can be kept at least equal to 250° C.

Since, cooling of the sealing areas 11 is performed after passage of the air from the wind box 13 through the opening 16 of the plate 10, the sealing areas 11 can be cooled to less to 350° C. or less. The cooling air which has cooled the sealing areas 11 is evacuated to the outside (discharged) from the cooling air outlet opening 33 of the cover 14 of the cover chamber 15.

When the size of the cooling air outlet opening 33 of the cover can be controlled, a suitable amount of cooling air can be obtained and also temperature control of the sealing areas 11 and of the insertion portion 8 of the lamps 4 can be easily performed.

Figure 9:
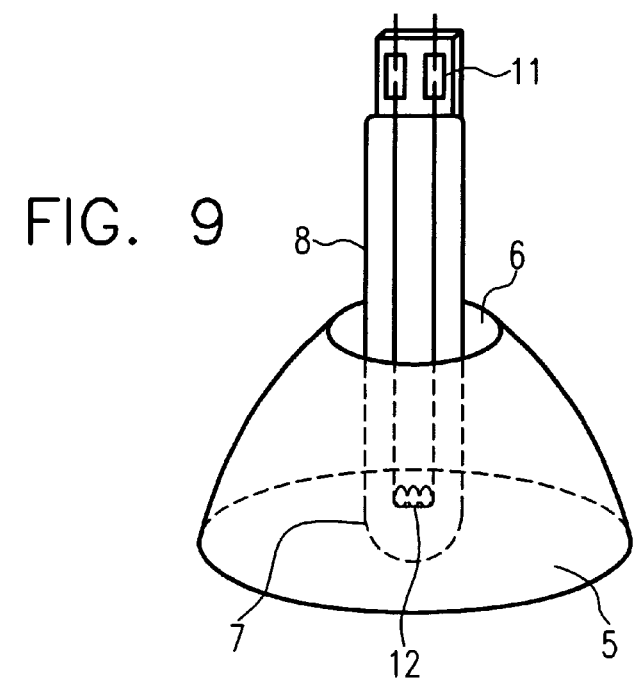
FIG. 9 is a perspective representation of the relation between the reflection surface of a mirror in a lamp of the single end type and the lamp.

In this embodiment, a case was described in which lamps with annular arc tube portions were used. However, regardless of the shape of the arc tube portion, the same cooling arrangement is possible. For example, the same cooling arrangement can be used even if lamps with semicircular arc tube portions are combined to create an annular arrangement, or lamps with rod-shaped or rectangular arc tube portions are used. Furthermore, the same cooling arrangement can be used even if a lamp of the single end type is used in which there is only one sealing area. In such a case, as is shown in FIG. 9, the reflection surface of the mirror 5 can be made cup-shaped and provided with a through opening 6 which is penetrated by the insertion tube 8 and the sealing area 11 of the lamp 4.

ACTION OF THE INVENTION

As was described above, the following effects can be achieved in accordance with the invention:

1. Even if a large input power is supplied to the lamp, the temperature of the arc tube portion of the lamp can be depressed to a temperature at which no devitrification occurs.
2. Even if a large input power is supplied to the lamp, a temperature of the sealing area of the lamp can be obtained at which no oxidation of the foil occurs.
3. Even if cooling is performed for the above described two points, the temperature of the insertion tube of the lamp can be maintained at a temperature at which a halogen cycle occurs.

A cooling arrangement of a heating device of the light irradiation type can be devised which can meet all the above described conditions at the same time.

What we claim is:

1. Cooling arrangement of a heating device of the light irradiation type having a light irradiation chamber in which several lamps are disposed, each lamp having an arc tube portion, at least one insertion tube, and at least one sealing area, comprising:

a mirror located behind the arc tube portion of the lamps for reflecting light emitted therefrom, the mirror having opening through which the at least one insertion tube and the at least one sealing area of each of the lamps passes;

a cover chamber which has a plate with opening through which the at least one sealing area of each of the lamps passes, and a cover with an opening for cooling air; and a wind box which is located between the plate of the cover chamber and the mirror, and which is connected via a channel to a means for creating a flow of cooling air;

wherein the light irradiation chamber has an opening for cooling air; wherein the means for creating a flow of cooling air is connected to the opening for cooling air in the cover via the opening of the cover chamber plate, the wind box and the channel; and wherein the means for creating a flow of cooling air is connected to the opening for cooling air in the light irradiation chamber via the opening of the mirror, the wind box and the channel.

2. Cooling arrangement as claimed in claim 1, wherein the openings for cooling air of the light irradiation chamber and of the cover are inlet openings for the entry of cooling air; and wherein the means for creating a flow of cooling air is an evacuation means for drawing air in through the inlet openings.

3. Cooling arrangement as claimed in claim 2, wherein at least one of the inlet openings for cooling air has means for changing the size of thereof.

4. Cooling arrangement as claimed in claim 1, wherein the openings for cooling air of the light irradiation chamber and of the cover are outlet openings for cooling air; and wherein the means for creating a flow of cooling air is an air injection means for blowing air in through the channel.

5. Cooling arrangement as claimed in claim 4, wherein at least one of the outlet openings for cooling air has means for changing the size of thereof.

* * * * *